United States Patent
Nonaka

(10) Patent No.: US 8,264,476 B2
(45) Date of Patent: Sep. 11, 2012

(54) ACTIVE MATRIX TYPE SEMICONDUCTOR DEVICE

(75) Inventor: Yoshihiro Nonaka, Tokyo (JP)

(73) Assignee: NLT Technologies, Ltd., Kanagawa (JP)

( * ) Notice: Subject to any disclaimer, the term of this patent is extended or adjusted under 35 U.S.C. 154(b) by 548 days.

(21) Appl. No.: 11/055,781

(22) Filed: Feb. 11, 2005

(65) Prior Publication Data

US 2005/0179039 A1   Aug. 18, 2005

(30) Foreign Application Priority Data

Feb. 13, 2004  (JP) ................................ 2004-036023

(51) Int. Cl.
*G06F 3/041*     (2006.01)
(52) U.S. Cl. ....................................... 345/204; 327/148
(58) Field of Classification Search .................. 345/204, 345/211; 327/148
See application file for complete search history.

(56) References Cited

U.S. PATENT DOCUMENTS

| | | | | |
|---|---|---|---|---|
| 5,754,155 A * | 5/1998 | Kubota et al. | | 345/98 |
| 5,995,189 A * | 11/1999 | Zhang | | 349/153 |
| 6,903,599 B2 * | 6/2005 | Chen et al. | | 327/536 |
| 6,903,717 B2 * | 6/2005 | Takahashi et al. | | 345/100 |
| 7,129,939 B2 * | 10/2006 | Toyozawa et al. | | 345/211 |
| 7,369,143 B2 * | 5/2008 | Koyama | | 345/691 |
| 7,502,007 B2 * | 3/2009 | Ishii | | 345/98 |
| 2003/0011586 A1 * | 1/2003 | Nakajima | | 345/211 |

FOREIGN PATENT DOCUMENTS

| | | |
|---|---|---|
| JP | 63-13582 A | 1/1988 |
| JP | 2-18960 A | 1/1990 |
| JP | 2-90126 A | 3/1990 |
| JP | 8-076147 A | 3/1996 |
| JP | 8-201763 A | 8/1996 |
| JP | 9-051485 A | 2/1997 |
| JP | 10-010546 A | 1/1998 |

(Continued)

OTHER PUBLICATIONS

J. R. Ayers et al., "I-3.3: A Highly Integrated AMLCD with Low Voltage Operation", Philips Mobile Display Systems, Heerlen, the Netherlands.

(Continued)

*Primary Examiner* — Alexander Eisen
*Assistant Examiner* — Christopher E Leiby
(74) *Attorney, Agent, or Firm* — Sughrue Mion, PLLC

(57) ABSTRACT

The present invention relates to a semiconductor device in which a power supply circuit is disposed on an array substrate, which achieves reduction of the size by suppressing an increase of the area occupied by the power supply wiring. The feature of the present invention is that a power supply circuit is disposed adjacent to a supply voltage input terminal and a signal line driving circuit. An extremely large amount of electric current is flown in a power supply wiring between the power supply circuit and the supply voltage input terminal and a power supply wiring between the power supply circuit and the signal line driving circuit. Thus, by disposing the power supply circuit adjacent to the supply voltage input terminal and the signal line driving circuit, the power supply wirings therebetween can be shortened. Accordingly, the wiring resistance proportional to the product of the length and the width becomes small so that the thinned power supply wiring can be tolerated. As a result, the power supply wirings can be shortened and thinned so that the wiring area can be decreased.

10 Claims, 14 Drawing Sheets

FOREIGN PATENT DOCUMENTS

| | | |
|---|---|---|
| JP | 11-337972 A | 12/1999 |
| JP | 2000-122027 A | 4/2000 |
| JP | 2000-231115 A | 8/2000 |
| JP | 2000-284866 A | 10/2000 |
| JP | 2001-235722 A | 8/2001 |
| JP | 2001-268894 A | 9/2001 |
| JP | 2001-343945 A | 12/2001 |
| JP | 2002-175027 A | 6/2002 |
| JP | 2002-207441 A | 7/2002 |
| JP | 2002-358025 A | 12/2002 |
| JP | 2003-029296 A | 1/2003 |
| JP | 2003-167562 A | 6/2003 |
| JP | 2004-4243 A | 1/2004 |
| JP | 2004-23832 A | 1/2004 |

OTHER PUBLICATIONS

Noboru Toyozawa et al., 16.1: Low-Power Integrated Circuit Technologies Using Low Temperature Poly-Si TFTs for Mobile Device Applications, 2002, SID 02 Digest, pp. 686-689.

* cited by examiner

ACTIVE MATRIX TYPE SEMICONDUCTOR DEVICE

BACKGROUND OF THE INVENTION

1. Field of the Invention

The present invention relates to an active matrix type semiconductor device in which a large number of switch devices are arranged in matrix.

2. Description of the Related Art

The active matrix type semiconductor device in which a large number of thin-film transistors (referred to as "TFT" hereinafter) are arranged in matrix as the switch devices is widely utilized since it enables to achieve a small and highly reliable device with low electric power. For example, since the active matrix type semiconductor device is thin and lightweight and used for a display device using liquid crystals or EL materials or a sensor device comprising light-receiving device such as photodiode, it is widely used as an input/output unit of a portable information terminal equipment (referred to as "portable equipment" hereinafter) and the like. In recent years, actively developed is a technique for forming, on an array substrate in which a large number of TFTs are arranged in matrix, peripheral circuits such as a scanning line driving circuit and a signal line driving circuit using the same TFT. By integrating the peripheral circuits on the array substrate, it is possible to increase the effective area of the active matrix region as a display unit or a sensor unit. Also, it enables to reduce the cost required for the peripheral circuits.

In the case of the portable equipment, in general, the external power voltage inputted from outside is limited to a low voltage such as from a battery. However, the voltage for driving a liquid crystal display device or a light-receiving device such as photodiode is not necessarily the same as the external power voltage and, in general, it requires a high voltage. Further, in order for the TFT to be in a selected state or unselected state, it is necessary to be driven by a still higher voltage than that of the scanning line driving circuit. Therefore, a power supply circuit for boosting the external power voltage such as a battery becomes essential in the portable equipment. As a booster circuit, popularly used is a charge pump circuit comprising a capacitor and a switch, which is small and exhibits low power consumption.

Japanese Patent Unexamined Publication No. 2002-175027 and Japanese Paten Unexamined Publication No. 2001-343945 disclose technologies for forming a charge pump booster circuit on an array substrate in the same manner as that of peripheral circuits. The power supply circuit formed on the array substrate has a function of generating a power voltage to be supplied to an active matrix region and to the peripheral circuits, having a voltage from an external IC disposed outside the array substrate as an input. Generally, the power voltage supplied to the active matrix region, in many of the cases, may have a higher potential with respect to the power voltage for driving a logic circuit, or may be a negative potential in which the polarity is inversed. Thus, when the external IC directly supplies the power voltage to the peripheral circuits, it is necessary in a manufacturing process of the external IC to add a step for manufacturing a transistor with high pressure-resistance separately from the one for the logic circuit. Therefore, forming the power supply circuit on the array substrate leads to simplification of the structure and the manufacturing process of the power supply circuit in the external IC, which achieves a reduction of the cost.

A first drawback of the conventional case to be overcome is that a layout area required for power supply wiring becomes large in a power supply circuit disposed on an array substrate. That is, there is a long distance between the coupling terminal group including a power voltage input terminal and the power supply circuit, so that it is necessary to expand the wiring width for decreasing the wiring resistance. When the wiring width is expanded, the area of the array substrate occupied by components other than the active matrix region is increased so that a small-scale device cannot be achieved.

A second drawback is that it cannot supply the stable voltage to the signal line driving circuit with high power consumption. That is, when the distance between the power supply circuit and the signal line driving circuit is distant, the wiring resistance therebetween becomes large. Thus, the voltage drop fluctuates due to a change in the supplied current so that the stable voltage cannot be supplied.

SUMMARY OF THE INVENTION

An object of the present invention is to achieve a small-scale active matrix type semiconductor device (simply referred to as "semiconductor device" hereinafter), in which a power supply circuit is disposed on an array substrate, through suppressing an increase in the area occupied by the power source wiring.

The semiconductor device of the present invention comprises, on a same substrate:

an active matrix region including signal lines and scanning lines being arranged in matrix with respect to each other and switch devices provided at intersection points of the signal lines and the scanning lines;

a scanning line driving circuit for driving the scanning lines;

a signal line driving circuit for driving the signal lines;

a coupling terminal group used for electrically coupling with outside; and a power supply circuit for converting supply voltage inputted from the coupling terminal group into a prescribed output voltage and supplying the output voltage to the signal line driving circuit and a voltage terminal of the signal line driving circuit, wherein the power supply circuit is disposed adjacent to the coupling terminal group while being in a side of the substrate where the signal line driving circuit is disposed.

An extremely large amount of electric current is flown in the power supply wiring between the power supply circuit and the coupling terminal group and the power supply wiring between the power supply circuit and the signal line driving circuit. Thus, by disposing the power supply circuit adjacent to the coupling terminal group and also in the side of the substrate where the signal line driving circuit is disposed, the power supply wiring therebetween can be shortened. Accordingly, the wiring resistance proportional to the product of the length and the width becomes small so that narrowing the width of the power supply wiring can be tolerated. Therefore, the power supply wiring therebetween can be shortened and thinned so that the wiring area can be decreased.

It is desirable that the power supply circuit be disposed adjacent to the scanning line driving circuit.

By disposing the power supply circuit adjacent to the scanning line driving circuit, the power supply wiring therebetween can be shortened and thinned so that the wiring area can be decreased.

It is desirable that the power supply circuit be disposed in a corner of the substrate. By disposing the power supply circuit in the corner of the substrate as described above, the size of the substrate can be decreased.

The power supply circuit may include a voltage stabilizing circuit for stabilizing the output voltage.

By supplying the supply voltage to the signal line driving circuit from the voltage stabilizing circuit adjacent to the signal line driving circuit, the wiring resistance becomes small so that the voltage which is stable for the fluctuation of the supplied current can be supplied.

The power supply circuit may include a booster circuit for boosting the supply voltage for converting it to the output voltage, and a driving circuit for driving the booster circuit.

By providing the driving circuit for driving the booster circuit, the power loss in the booster circuit is decreased and the power supply capacity is increased. Thus, the area of the booster circuit can be decreased. In other words, the power loss in the booster circuit is decreased and the power supply capacity is improved by providing the driving circuit, so that it enables to form a small-scale power supply circuit in which the area occupied by the switches forming the booster circuit is decreased. The booster circuit is a charge pump circuit, for example, and the driving circuit is a level shift circuit, for example.

It is desirable that the booster circuit include a plurality of thin-film transistors disposed in series in a gate-length direction, and the thin-film transistors disposed next to each other share a source electrode or a drain electrode with each other.

The adjacent TFTs share the source electrode or the drain electrode, so that the width is narrowed and the area is decreased for the entire booster circuit.

A load of the active matrix region has a display function or a sensing function.

The area of the power supply wiring is small so that it enables to achieve a display device with a large proportion of the display unit area or a sensor device with a large proportion of sensor unit area. The display device is the liquid crystal, EL, LED or the like, for example, and the sensor device is a light sensor device, a temperature sensor device, a pressure sensor device or the like, for example.

It is desirable that the switch device be a thin-film transistor. If the switch device is the TFT, it can be manufactured through the same process as the TFT which forms other circuits on the same substrate. The switch device may be TFD or MIM.

Thus, by disposing the power supply circuit adjacent to the coupling terminal group and also in the side of the substrate where the signal line driving circuit is disposed, the power supply wiring therebetween can be shortened and thinned so that the wiring area can be decreased. Accordingly, the size of the substrate can be decreased. Otherwise, by forming other circuits on the substrate of the same size, a highly-density integrated device can be achieved.

BRIEF DESCRIPTION OF THE DRAWINGS

FIG. 6 is a circuit diagram for showing a specific example of the charge pump circuit shown in FIG. 6;

FIG. 7 is a graph showing the performance of the charge pump circuit of the fourth embodiment and that of the related art;

FIG. 8 illustrate an example of a level shift circuit of the fourth embodiment, in which FIG. 8 is a waveform chart showing an input/output signal and FIG. 8 is a circuit diagram showing the configuration;

FIG. 12 are circuit diagrams for showing a booster circuit of EXAMPLE 1, in which FIG. 12 is a first circuit, FIG. 12 is a second circuit, and FIG. 12 is a third circuit;

DESCRIPTION OF THE PREFERRED EMBODIMENTS

Next, embodiments of the present invention will be described in detail by referring to accompanying drawings.

Figure 1:
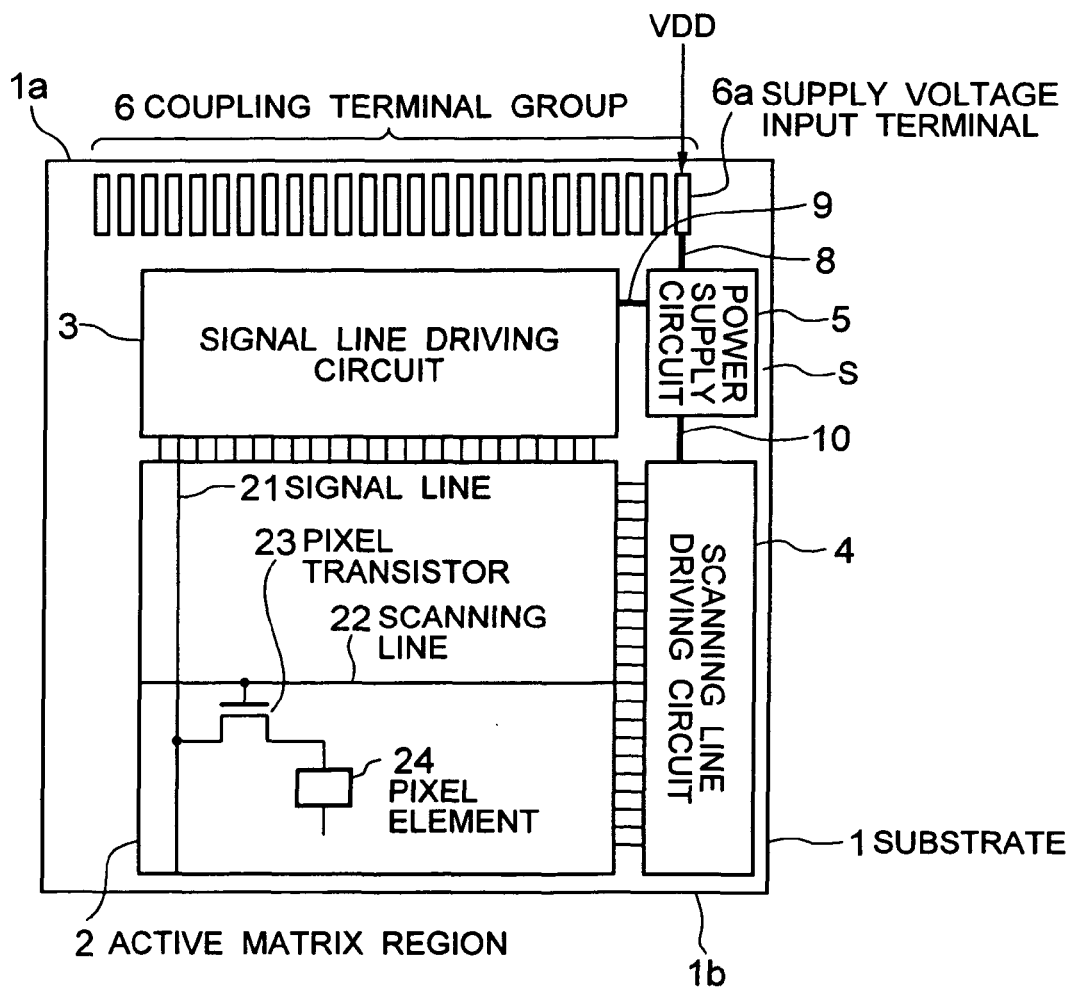
FIG. 1 is a circuit diagram for showing a first embodiment of a semiconductor device according to the present invention.

FIG. 1 is a circuit diagram for showing a first embodiment of a semiconductor device according to the present invention. Description will be provided hereinafter by referring to the drawing.

The semiconductor device of the embodiment comprises, being formed on a same substrate 1, an active matrix region 2, a signal line driving circuit 3, a scanning line driving circuit 4, a power supply circuit 5 and a coupling terminal group 6. In the active matrix region 2, a plurality of signal lines 21 and a plurality of scanning lines 22 are arranged in matrix. Pixel transistors 23, which are controlled through the signal lines 21 and the scanning lines 22, are disposed at intersection points of the signal lines 21 and the scanning lines 22, and pixel elements 24 are coupled to the pixel transistors 23.

In the active matrix region 2, a plurality of the signal lines 21 and a plurality of the scanning lines 22 are respectively arranged in length directions of two sides of the active matrix region 2 crossing with each other. The signal line driving circuit 3 and the scanning line driving circuit 4 are formed in a long-thin shape. The long-thin-shape signal line driving circuit 3 and the scanning line driving circuit 4 are arranged along the line of the signal lines (21) and the line of the scanning lines (22) of the active matrix region 2. The signal line driving circuit 3 drives the signal lines 21 and the scanning line driving circuit 4 drives the scanning lines 22. The power supply circuit 5 converts a supply voltage VDD inputted from a supply voltage input terminal 6a within the coupling terminal group 6 into a prescribed voltage, and supplies it to the signal line driving circuit 3 and the scanning line driving circuit 4.

As show in FIG. 1, the coupling terminal group 6 is formed along a side 1a of the substrate 1. The active matrix region 2 is formed on the substrate 1 in such a manner that the line of the signal lines (21) is disposed along a side 1b which opposes the side 1a along which the coupling terminal group 6 is formed. The scanning line driving circuit 4 is formed along the line of the scanning lines (22) of the active matrix region 2. The signal line driving circuit 3 is formed along the line of the signal lines (21) of the active matrix region 2. Thereby, the signal line driving circuit 3 is formed along a side of the substrate 1 being adjacent to the coupling terminal group 6.

As can be seen from FIG. 1, there is a space S in the corner of the substrate 1 on the side 1a side where the signal line driving circuit 3 is disposed. Thus, a part of the terminals among the coupling terminal group 6, which faces the space S, is formed as the supply voltage input terminal 6a. Further, within the space S, the power supply circuit 5 is disposed adjacent to the coupling terminal group 6, especially to the supply voltage input terminal 6a, while being in the side 1a of the substrate 1 where the signal line driving circuit 3 is disposed.

As described above, the embodiment is distinctive in respect that the wiring length for coupling the power supply circuit 5, the signal line driving circuit 3 and the scanning line driving circuit 4 is shortened by disposing the power supply circuit 5 adjacent to the coupling terminal group 6 using the space (corner of the substrate 1) S while being in the side 1a of the substrate 1 where the signal line driving circuit 3 is disposed.

In a power supply wiring 8 between the power supply circuit 5 and the supply voltage input terminal 6a and in a power supply wiring 9 between the power supply circuit 5 and the signal line driving circuit 3, an extremely large amount of current is flown. Thus, by disposing the power supply circuit 5 adjacent to the supply voltage input terminal 6a and the signal line driving circuit 3, the supply wirings 8, 9 therebetween are shortened. Thereby, the wiring resistance proportional to the product of the length and the width becomes small so that the tinned power supply wirings 8, 9 can be tolerated. Therefore, the power supply wirings 8, 9 can be shortened and thinned so that the wiring area can be decreased.

Further, the power supply circuit 5 is disposed adjacent to a scanning line driving circuit 10 as well. Thus, a power supply wiring 10 therebetween is also shortened and thinned so that the wiring area can be further decreased.

Next, it will be described in more detail.

The active matrix region 2 formed on the substrate 1 of insulating body such as a glass substrate is constituted of: the signal lines 21 and the scanning lines 22 disposed in matrix with respect to each other; the pixel transistors 23 disposed at the intersection points of the signal lines 21 and the scanning lines 22; and the pixel elements 24 coupled to the pixel transistors 23. The numbers of the signal lines 21, the scanning lines 22, the pixel transistors 23 and the pixel elements 24 are extremely large so that one each is illustrated in the drawing for the convenience' sake. In the case where liquid crystals, ELs, LEDs or the like are used as the pixel elements 24, the active matrix region 2 is to have a display function. The active matrix region 2 displays a visible information by being driven by the signal lines 21 and the scanning lines 22. When the elements 24 are the pixel elements 24, a pixel capacity or the like for holding the voltage of the pixel is contained. In the case where photodiode, a temperature detecting device, a pressure detecting device or the like is used as the element 24, the active matrix region 2 is to have a sensing display function. The active matrix region 2 becomes a sensor for detecting light, temperatures, pressures and the like by being driven by the signal lines 21 and the scanning lines 22.

The signal lines 21 are coupled to the signal line driving circuit 3 and the scanning lines 22 are coupled to the scanning line driving circuit 4. In the power supply circuit 5, the supply voltage VDD is inputted through the supply voltage input terminal 6a and the power supply wiring 8. At this time, the power supply circuit 5 and the supply voltage input terminal 6a are disposed in the positions adjacent to each other. The voltage generated by the power supply circuit 5 is supplied to the signal line driving circuit 3 and the scanning line driving circuit 4, respectively, through the power supply wiring 9 and the power supply wiring 10. Here, the power supply wiring 9 and the power supply wiring 10 may be of a plurality of kinds or in a plurality of numbers, respectively.

The features of the embodiment is that the power supply circuit 5 is disposed adjacent to the supply voltage input terminal 6a, and the power supply circuit 5 is disposed in the side out of the four sides of the active matrix region 2 where the signal line driving circuit 3 is disposed. Thereby, the area of the power supply wiring 8 can be decreased. The electric power supplied from the power supply circuit 5 to other circuits are inputted through the power supply wiring 8 so that there is a larger amount of electric current flown in the power supply wiring 8 compared to other power supply wirings. Thus, it is necessary to reduce the wiring resistance of the power supply wiring 8. In the embodiment, the supply voltage input terminal 6a and the power supply circuit 5 are adjacent to each other so that the resistance can be kept low even with the thin and short wiring.

Figure 2:
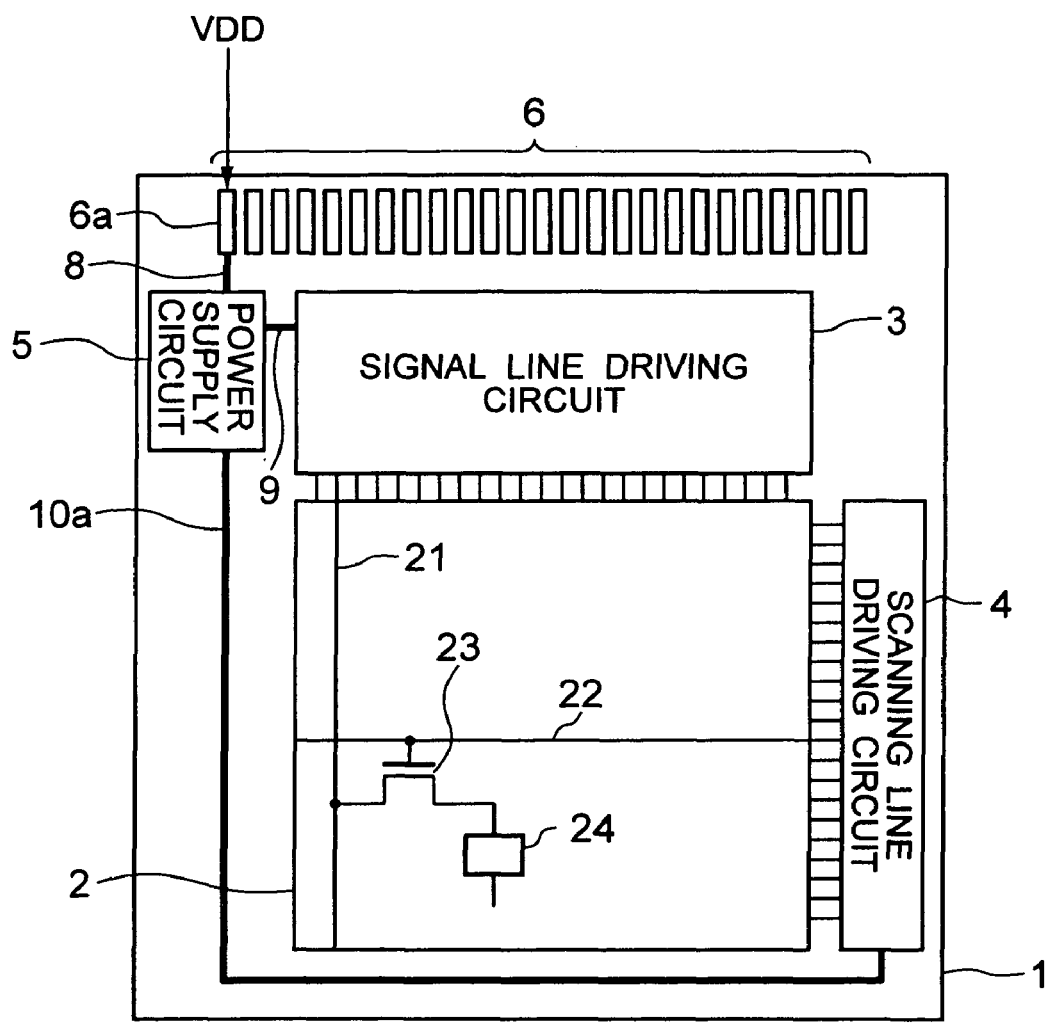
FIG. 2 is a circuit diagram for showing a second embodiment of the semiconductor device according to the present invention.

FIG. 2 is a circuit diagram for showing a second embodiment of the semiconductor device according to the present invention. Description will be provided hereinafter by referring to the drawing. However, the description of the same components as the ones in FIG. 1 will be omitted by applying the same reference numerals.

The semiconductor of the embodiment has the same feature as that of the first embodiment, however, the power supply circuit 5 is disposed in the position distant from the scanning line driving circuit 4 through the power supply wiring 10a while being disposed adjacent to the supply voltage input terminal 6a and the signal line driving circuit 3. Reduction of resistance of the power supply wiring is for avoiding the voltage drop at the time of supplying the electric power and it is more necessary for the wiring with a large amount of supplied electric current, that is, for the wiring being coupled to a circuit with the large power consumption. The signal line driving circuit 3 includes a digital-analog converter for converting the digital data inputted from outside into the analog voltage to be applied to the pixel element 24, and an analog-digital converter for reading out the analog voltage held in the pixel element 24 and converting it to the digital data for outputting it outside the substrate 1. Thus, the power consumption is increased. In the meantime, the scanning line driving circuit 4 only increases and decreases the electric potential of the scanning line 22 coupled to the gate terminal of the pixel transistor 23 for switching ON/OFF of the pixel transistor 23, so that the power consumption is low. Therefore, in terms of reducing the wiring area, it is more effective when the power supply circuit 5 is disposed more adjacent to the signal line driving circuit 3 than the scanning line driving circuit 4.

Figure 3:
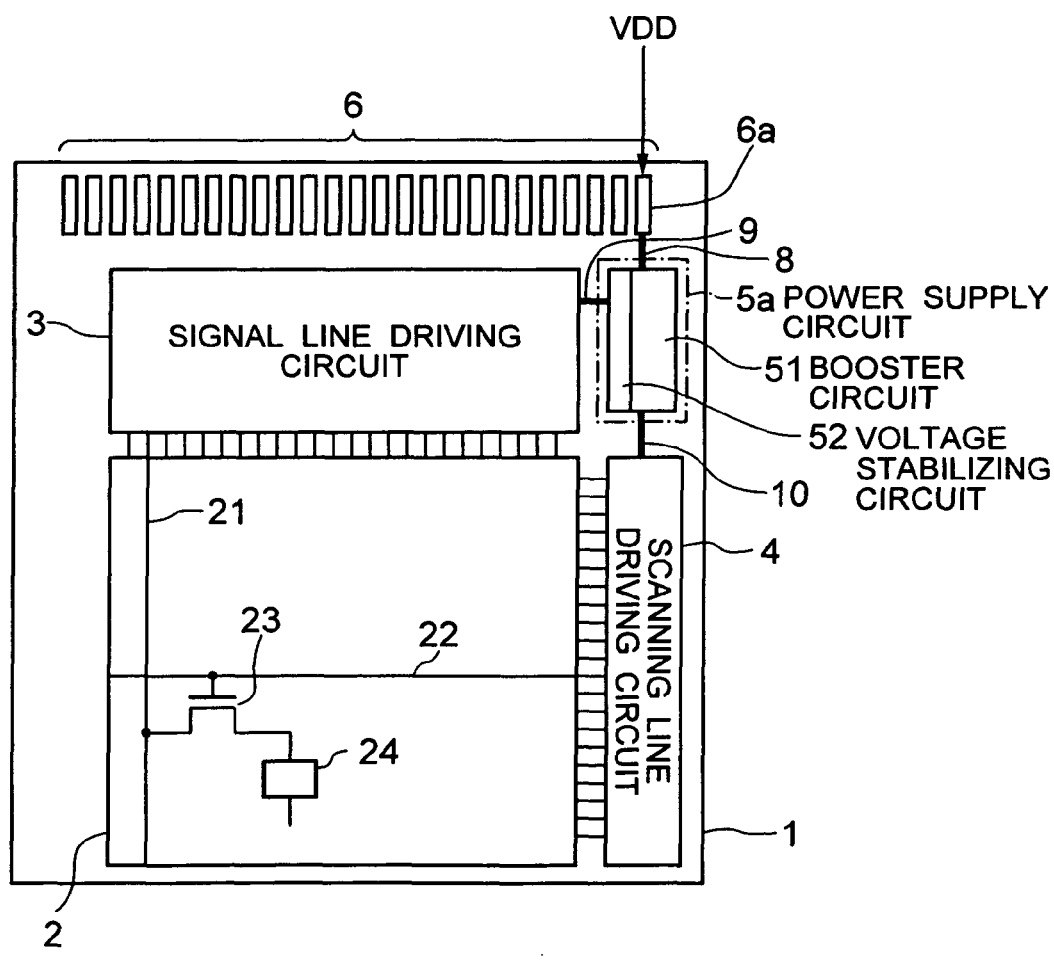
FIG. 3 is a circuit diagram for showing a third embodiment of the semiconductor device according to the present invention.

FIG. 3 is a circuit diagram for showing a third embodiment of the semiconductor device according to the present invention. Description will be provided hereinafter by referring to the drawing. However, the description of the same components as the ones in FIG. 1 will be omitted by applying the same reference numerals.

The difference of the embodiment between with the first embodiment is that a power supply circuit 5a includes a booster circuit 51 for converting the supply voltage VDD to the still higher voltage and includes a voltage stabilizing circuit 52 for supplying the stabilized voltage. As for the signal line driving circuit 3, the power consumption is especially high and is an unstable load in which the electric power fluctuates. Therefore, by applying the voltage generated by the booster circuit 51 to the signal line driving circuit 3 through the stabilizing circuit 52, a constant voltage for the load fluctuation can be obtained. When the power supply circuit 5a including the stabilizing circuit 52 is disposed away from the signal line driving circuit 3, which is different from the embodiment, the power supply wiring 9 therebetween is extended, there by increasing the resistance. Therefore, there is a drastic voltage drop being caused at the time of supplying the voltage so that the stable voltage cannot be supplied. Thus, as in the embodiment, by disposing the power supply circuit 5a including the voltage stabilizing circuit 52 adjacent to the signal line driving circuit 3, it enables to supply the stable voltage without increasing the area of the power supply wiring.

Figure 4:
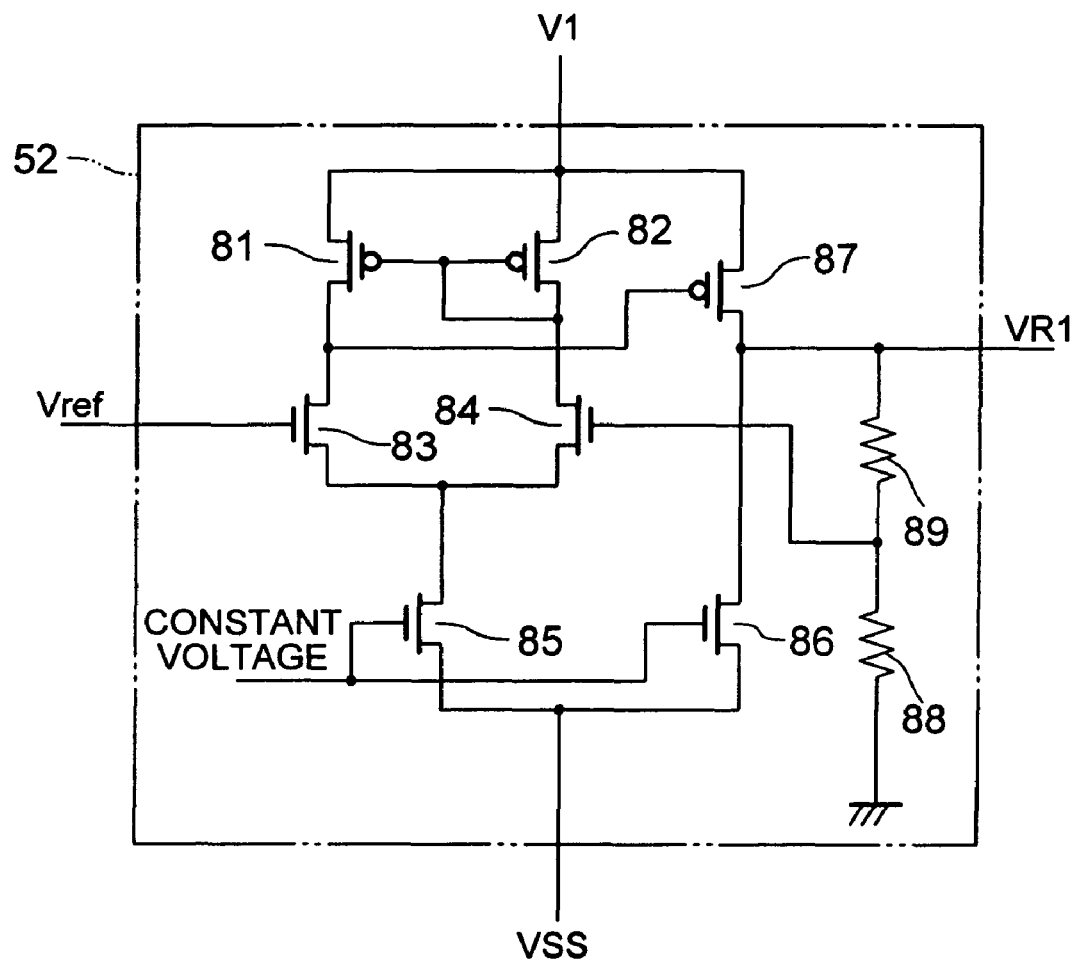
FIG. 4 is a circuit diagram for showing an example of a voltage stabilizing circuit of the third embodiment.

FIG. 4 is a circuit diagram for showing an example of the voltage stabilizing circuit of the third embodiment. Description will be provided hereinafter by referring to the drawing.

The voltage stabilizing circuit 52 is an ordinary differential amplifier circuit constituted of transistors 81-87 for differential amplification and resistors 88, 89 for dividing pressure, which outputs a stabilized voltage VR1 in which the difference between the boosted voltage V1 (variable) and reference voltage Verf (fixed) is stabilized.

Figure 5:
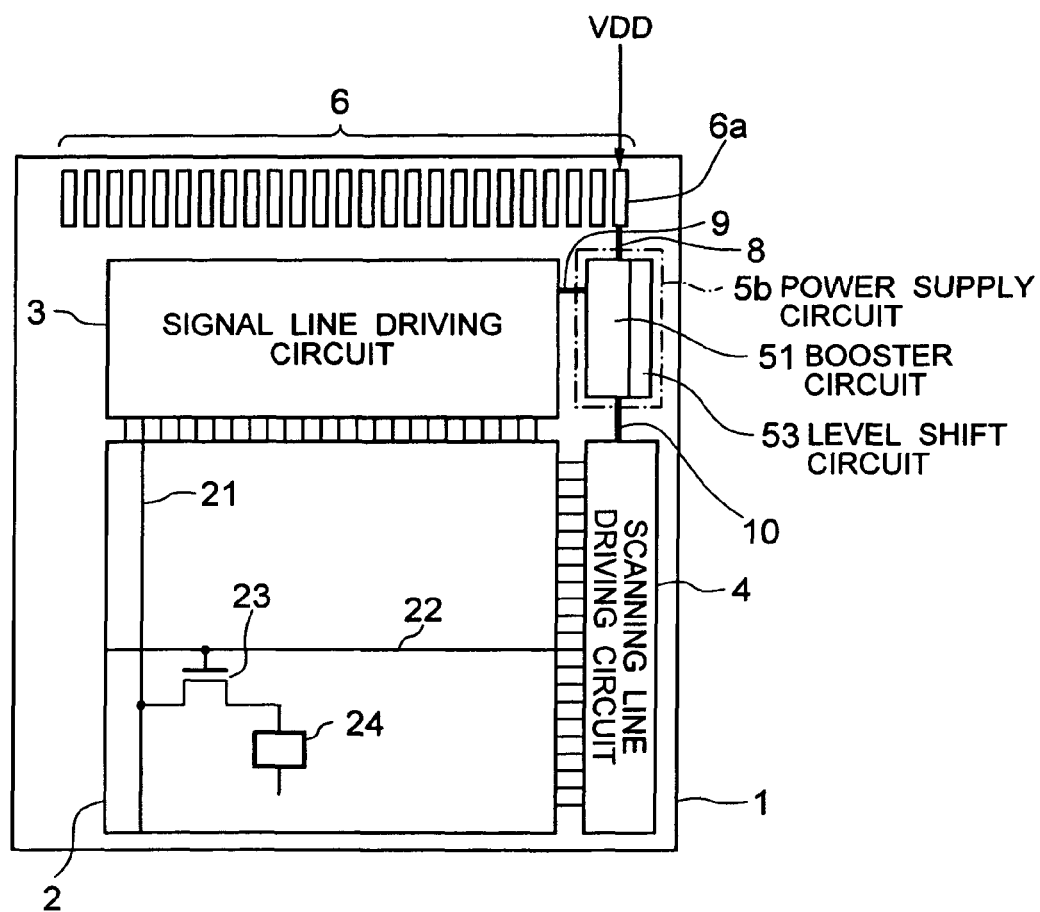
FIG. 5 is a circuit diagram for showing a fourth embodiment of the semiconductor device according to the present invention.

FIG. 5 is a circuit diagram for showing a fourth embodiment of the semiconductor device according to the present invention. Description will be provided hereinafter by referring to the drawing. However, the description of the same components as the ones in FIG. 1 will be omitted by applying the same reference numerals.

The difference with respect to the first embodiment is that a power supply circuit 5b includes a booster circuit 51 for converting the supply voltage. VDD to the still higher voltage and a level shift circuit 53 for driving the booster circuit 51. The level shift circuit 53 generates a signal with a large amplitude for controlling ON/OFF of the switch constituting the booster circuit 51.

Figure 6:
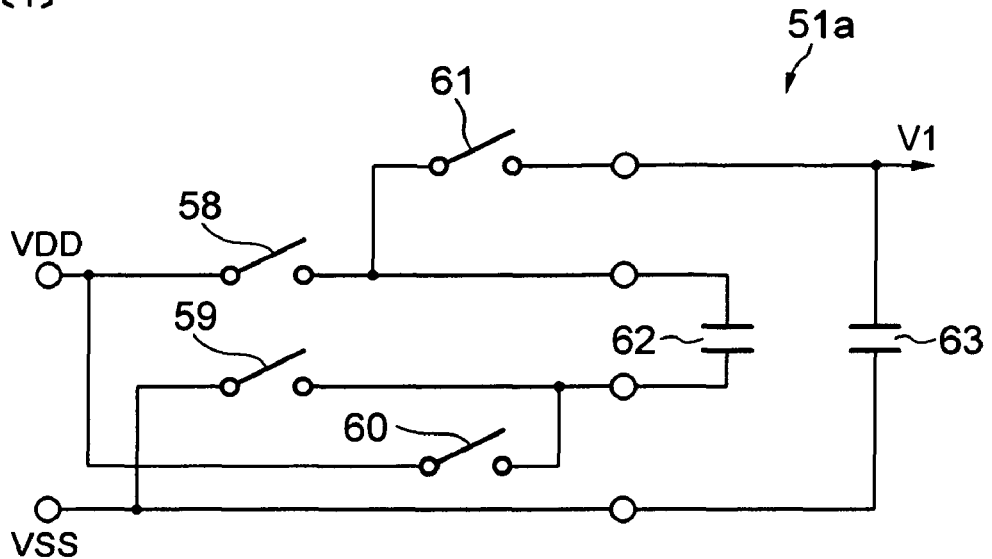
FIG. 6 is a circuit diagram for showing the principle of a charge pump circuit as a booster circuit of the fourth embodiment.
Figure 6:
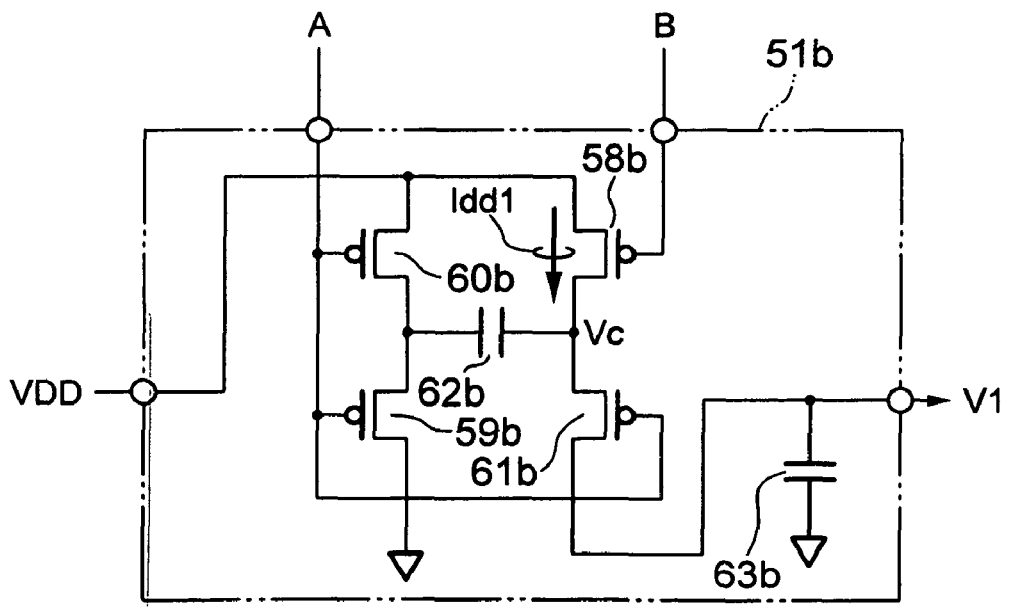
Figure 7:
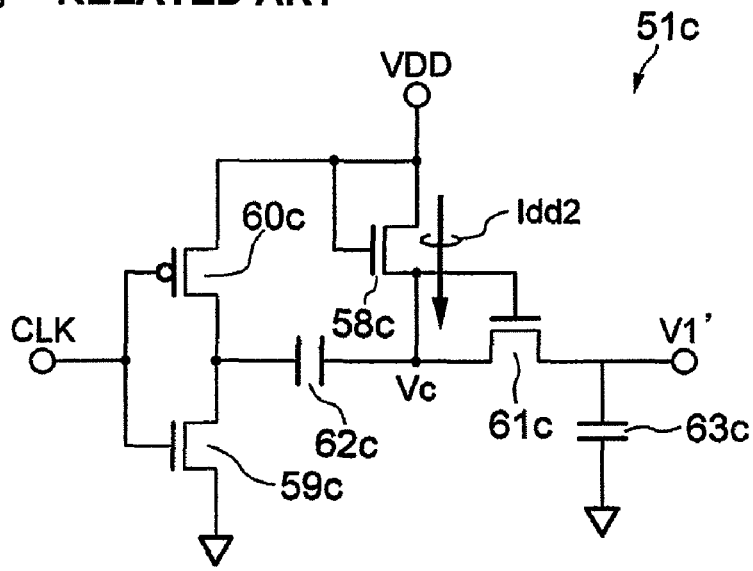
FIG. 7 is a circuit diagram for showing a charge pump circuit of the related art.
Figure 7:
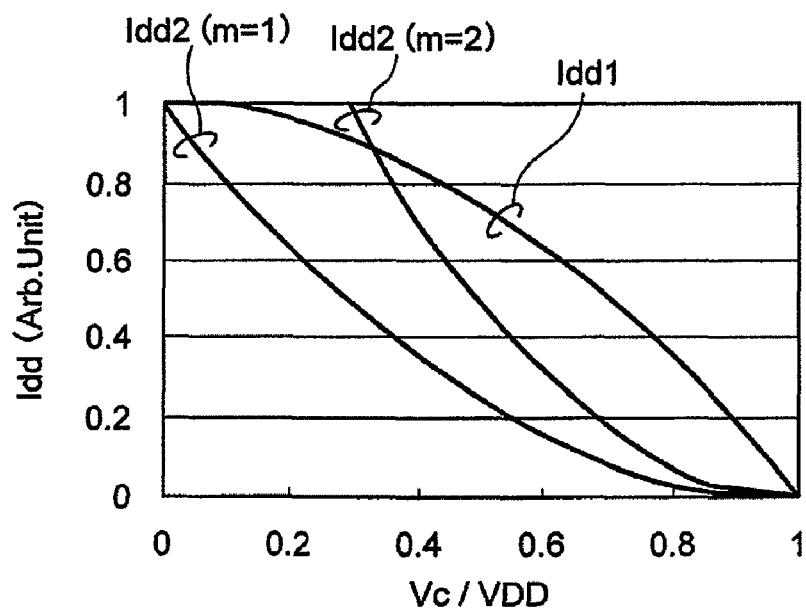
Figure 8:
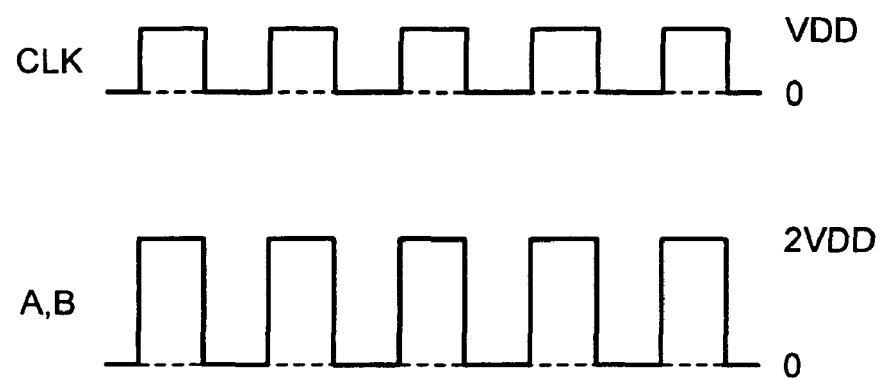
Figure 8:
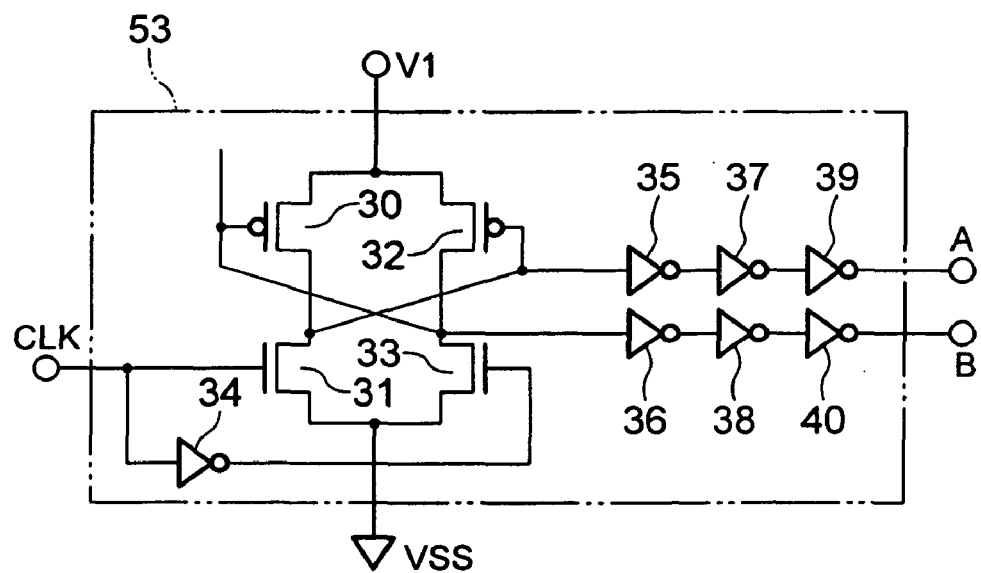

FIG. 6 is a circuit diagram for showing the principle of a charge pump circuit as a booster circuit shown in FIG. 5, and FIG. 6 is a circuit diagram for showing a specific example of the charge pump circuit of FIG. 6. FIG. 7 is a circuit diagram for showing a charge pump circuit of the related art, and FIG. 7 is a graph showing the performance of the charge pump circuit of the embodiment and that of the related art. FIG. 8 illustrate an example of the level shift circuit of FIG. 5, in which FIG. 8 is a waveform chart showing an input/output signal and FIG. 8 is a circuit diagram for showing the configuration. Description will be provided hereinafter by referring to FIG. 5-FIG. 8.

The charge pump circuit 51a shown in FIG. 6 is constituted of switches 58-61, a capacitor 62 for boosting the voltage, and a capacitor 63 for holding the voltage, for converting the inputted supply voltage VDD into the boosted voltage V1 twice as high. The action of the charge pump circuit 51a will be described. First, the switches 58, 59 are closed and the switches 60, 61 are opened for applying the supply voltage VDD to the capacitor 62. Subsequently, the switches 58, 59 are opened and the switches 60, 61 are closed for further applying the supply voltage VDD to the capacitor 62. Thereby, the charged voltage of the capacitor 62 becomes 2VDD so that the boosted voltage V1 which is the twice the supply voltage VDD can be obtained. Next, described are two examples in which the charge pump circuit 51a is embodied.

The charge pump circuit 51c shown in FIG. 7 is the one disclosed in Japanese Patent Unexamined Publication No. 2001-343945 as mentioned above, which is constituted of TFTs 58c-61c, a capacitor 62c for boosting the voltage and the capacitor 63c for holding the voltage, and is used for converting the inputted supply voltage VDD into a boosted voltage V1' of about twice as high. In the chare pump circuit 61c, diode-coupling is employed in which the gates and the sources of the TFTs 58c and 61c are coupled. Thus, it operates by only a clock signal CLK so that there is no specific gate signal being required and a circuit for generating the gate signal becomes unnecessary. However, as for the TFTs 58c and 61c being diode-coupled, the threshold voltages to be applied to the gates are included in the voltage between the drain and the source. Accordingly, the ON resistance is increased. Thus, the voltage charged to the capacitors 62c, 63c by the charge pump circuit 51c is decreased, respectively, for the value of the threshold voltage of the TFTs 58c, 61c. The threshold voltage of the TFT is as high as 1V or more so that the voltage drop and the deterioration of the efficiency caused thereby cannot be ignored. Further, the ON resistance of the diode-coupled TFTs 58c, 61c is high so that the inner voltage drop when the load is high is drastic. That is, in the case where the electric current is supplied to the load by charging the electric charge to the capacitors 62c, 63c, when the amount of the electric current flown to the TFTs 58c, 61c is increased, a large voltage drop between the drain-source electrodes of the TFTs 58c, 61c is caused. Thus, a sufficient boosted voltage V1' cannot be supplied.

In the meantime, the charge pump circuit 51b shown in FIG. 6 is used in the embodiment, which is constituted of TFTs 58b-61b, a capacitor 62b for boosting the voltage and a capacitor 63b for keeping the voltage, and is used for converting the inputted supply voltage VDD into a boosted voltage V1 of about twice as high. In the charge pump circuit 51b, gate signals A, B are supplied to the TFTs 58b-61b using the level shift circuit 53 shown in FIG. 8. Thereby, ON/OFF of the TFTs 58b-61b can be achieved. Thus, it is not necessary that the TFTs 58b-61b be diode-coupled so that there is no voltage drop for the threshold voltage to be generated and the ON resistance can be decreased as well.

The level shift circuit 53 shown in FIG. 8 is constituted of TFTs 30-33 and inverters 34-40, which is for converting the inputted clock signal CLK (supply voltage VDD) into gate signals A, B (boosted voltage V1). The gate signals A, B may be any signals which take the highest voltage and the lowest voltage among the boosted voltage V1 generated by the charge pump circuit 51b as the high potential level and the low potential level, respectively. That is, by using the boosted voltage V1 generated by the charge pump circuit 51b as the supply voltage, it is possible to generate the gate signals A, B with high amplitude by the level shift circuit 53 which uses the clock signal CLK with the low amplitude as the input signal. The clock signal CLK is supplied from outside or by a clock generating circuit (not shown) disposed on the substrate 1.

In the case where the level shift circuit 53 for driving the charge pump circuit 51b is included in the power supply circuit 5, an increase of the circuit area due to adding the circuit becomes an issue. The inverters 35-40 functioning as a buffer in the output stage occupies the most of the area of the level shift circuit 53 shown in FIG. 8. The TFT (not shown) forming the inverters 39, 40 in the last stage drives the large TFTs 58b-61b of the charge pump circuit 51b so that about 1/10 to 1/3 of the area of the entire TFTs 58*b*-61*b* is required. Further, it is necessary to form the inverters 37, 38 in the pre-stage thereof by the TFT in the size of about 1/10 to 1/3. When the sizes of the inverters are increased by the above-described rate for driving TFTs from some tens (μm)² of TFTs forming the level shift circuit 53 to some thousands (μm)² of TFTs forming the charge pump circuit 51*b*, it requires the inverters of three to six stages.

For obtaining the entire area of the buffer through an expression, the area of the buffer which reduces from the last stage to the limit by the rate (1/3) is calculated. The area occupied by the buffer is expressed by a following expression, where the area occupied by the TFT of the charge pump circuit is S:

$$S = \Sigma_{n-1}^{\infty}(1/3)^n = S/2$$

Accordingly, the total area of the charge pump circuit and the level shift circuit is (1+1/2) S, which is about 1.5 times the area of only the charge pump circuit.

The performances of the case where the TFTs being diode-coupled are used (FIG. 7, referred to as "diode type" hereinafter) and the case where the TFTs in the same area-size as that of the first case are used as the switch to which the gate signal is supplied (FIG. 6, referred to as "switch type" hereinafter) are compared. The clock signal CLK with the amplitude of VDD supplied from outside does not have the driving capacity for charging the capacitor 62*c* for boosting the voltage, so that it is necessary to add a clock buffer on the substrate 1 in the case of the diode type. Accordingly, the number of the TFTs for both cases is four.

FIG. 7 shows the relation between an electric potential Vc of the terminal of the boosting capacitor at the time of charging and an electric current Idd flown in between the drain-source terminals of the TFTs at that time. As for the electric current Idd, the case of the diode type is referred to as Idd2 and the case of the switch type is referred to as Idd1. Although the flown electric current Idd for charging is decreased during the process where charging is advanced and the electric potential of Vc is increased up to VDD, it can be seen that the electric current is always larger in the switch type than the diode type. This indicates that the voltage drop in the case of supplying the electric current to the load is smaller in the switch type. The electric current Idd increases in proportion to the channel width of the TFT, so that it is also possible to obtain the same electric current as that of the switch type in the diode type by using the TFT of a still larger area. An increase of the electric current and an increase of the area caused by multiplying the diode-type TFT by m are investigated.

In the charge pump circuit 51*c* of FIG. 7, the TFTs 58*c*, 61*c* which are used by being diode-coupled and require a size of m times is the half of the entire portion, so that the area of the diode-coupled TFTs 58*c*, 61*c* is ((1+m)/2) S. The TFT area of the switch-type charge pump circuit 51*b* shown in FIG. 6 is (3/2) S, in which the area of the level shift circuit 53 is added to the area S of the four switch TFTs 58*b*-61*b*. Accordingly, the condition by which the area of the switch type becomes smaller is m>2, according to $$((1+m)/2)S > (3/2)S$$

Compared are the current capacities of the cases of the switch type and the diode type when m=2, that is, the area is equal. As shown in FIG. 7, a larger amount of the electric current is flown in the diode type when the charge to the boosting capacity is less than 33% (Vc/VDD<0.33). However, when the charge voltage is higher than this value, the electric current is drastically decreased and the performance of the switch type is improved. The charged voltage is about 30%, the voltage to be boosted becomes as low as 1.3 VDD or less so that a sufficient boosting operation cannot be expected.

Figure 9:
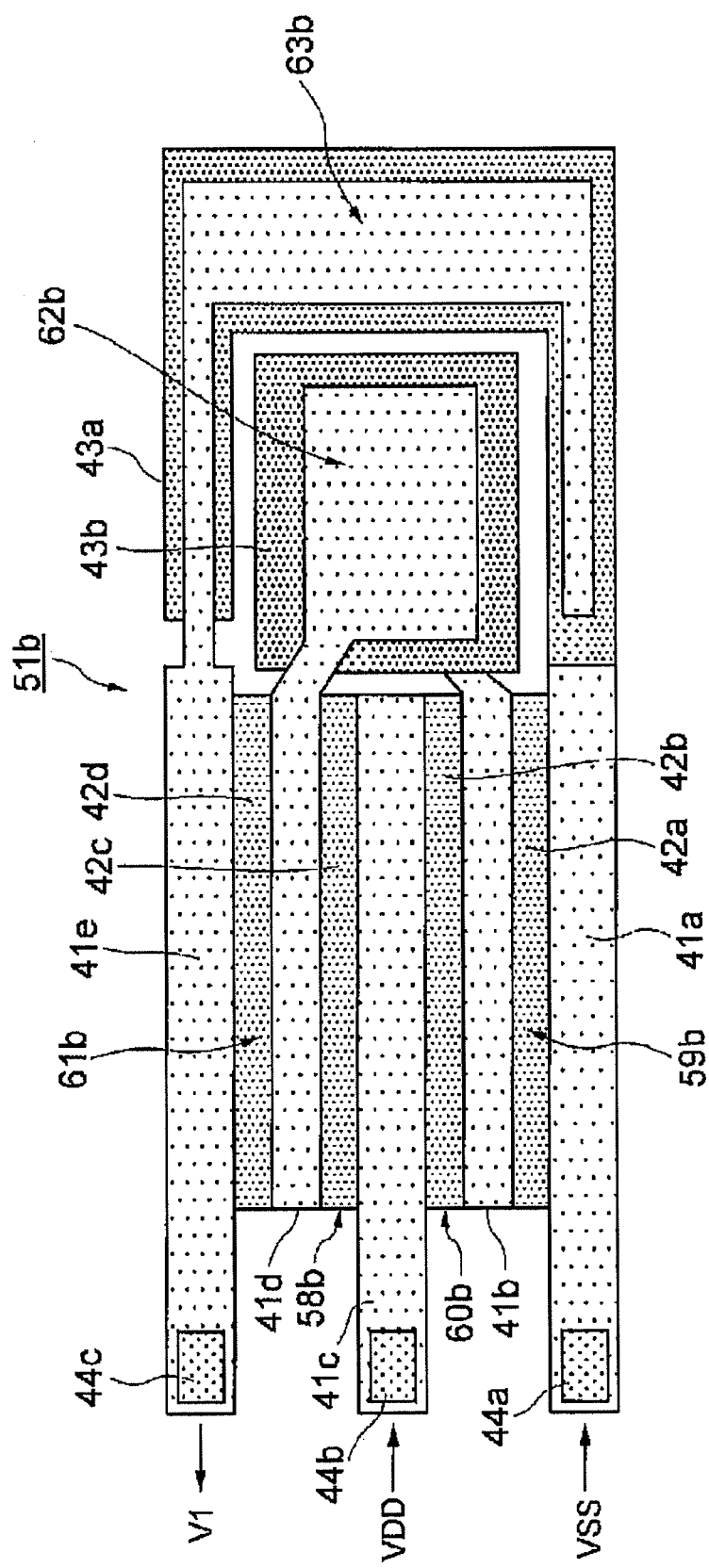
FIG. 9 is a fragmentary plan view for showing a fifth embodiment of a semiconductor according to the present invention.

FIG. 9 is a fragmentary top view for showing a fifth embodiment of the semiconductor device according to the present invention. Description will be provided hereinafter by referring to the drawing. However, the description of the same components as the ones in FIG. 6 will be omitted by applying the same reference numerals.

In the embodiment, the layout of the charge pump circuit 51*b* is distinctive. It is distinctive in respect that a plurality of TFTs 58*b*-61*b* are arranged in the gate length direction and the adjacent TFTs 58*b*-61*b* share the source electrodes or the drain electrodes. The charge pump circuit 51*b* is constituted of electrode layers 41*a*-41*e*, semiconductor layers 42*a*-42*d*, insulator layers 43*a*, 43*b*, gate electrodes (not shown) and the like. The electrode layers 41*a*, 41*b* are formed on the semiconductor layer 42*a*, the electrode layers 41*b*, 41*c* are formed on the semiconductor layer 42*b*, the electrode layers 41*c*, 41*d* are formed on the semiconductor layer 42*c*, and the electrode layers 41*d*, 41*e* are formed on the semiconductor layer 42*d*. The insulator layer 43*a* is interposed in between the electrode layers 41*a*, 41*e* (only the electrode layer 41*e* is illustrated), and the insulator layer 43*b* is interposed in between the electrode layers 41*b*, 41*d* (only the electrode layer 41*d* is illustrated). Further, the electrode layer 41*a*, to which a ground voltage VSS is applied, functions as the source electrode of the TFT 59*b* and the low-potential-side electrode of the capacitor 63*b*. The electrode layer 41*b* functions as the source electrode of the TFT 60*b*, the drain electrode of the TFT 59*b*, and the low-potential-side electrode of the capacitor 62*b*. The electrode layer 41*c*, to which the supply voltage VDD is applied, functions as the drain electrode of the TFT 58*b* and the drain electrode of the TFT 60*b*. The electrode layer 41*d* functions as the source electrode of the TFT 58*b*, the drain electrode of the TFT 61*b*, and the high-potential-side electrode of the capacitor 62*b*. The electrode layer 41*e*, to which the boosted voltage V1 is applied, functions as the source electrode of the TFT 61*b* and the high-potential-side electrode of the capacitor 63*b*. Here, it is illustrated to form the capacitors 62*b*, 63*b* on the substrate as the TFTs 58*b*-61*b*, however, they may be disposed outside the substrate and coupled to the TFTs 58*b*-61*b* through external coupling pads 44*a* 44*c*. The semiconductor layers 42*a*-42*d* may be formed as one as a whole or may be individually divided.

Example 1

Next, EXAMPLE 1 of the present invention will be described by referring to the drawings. The semiconductor device of the EXAMPLE is a case of a display device formed on a substrate such as glass.

Figure 10:
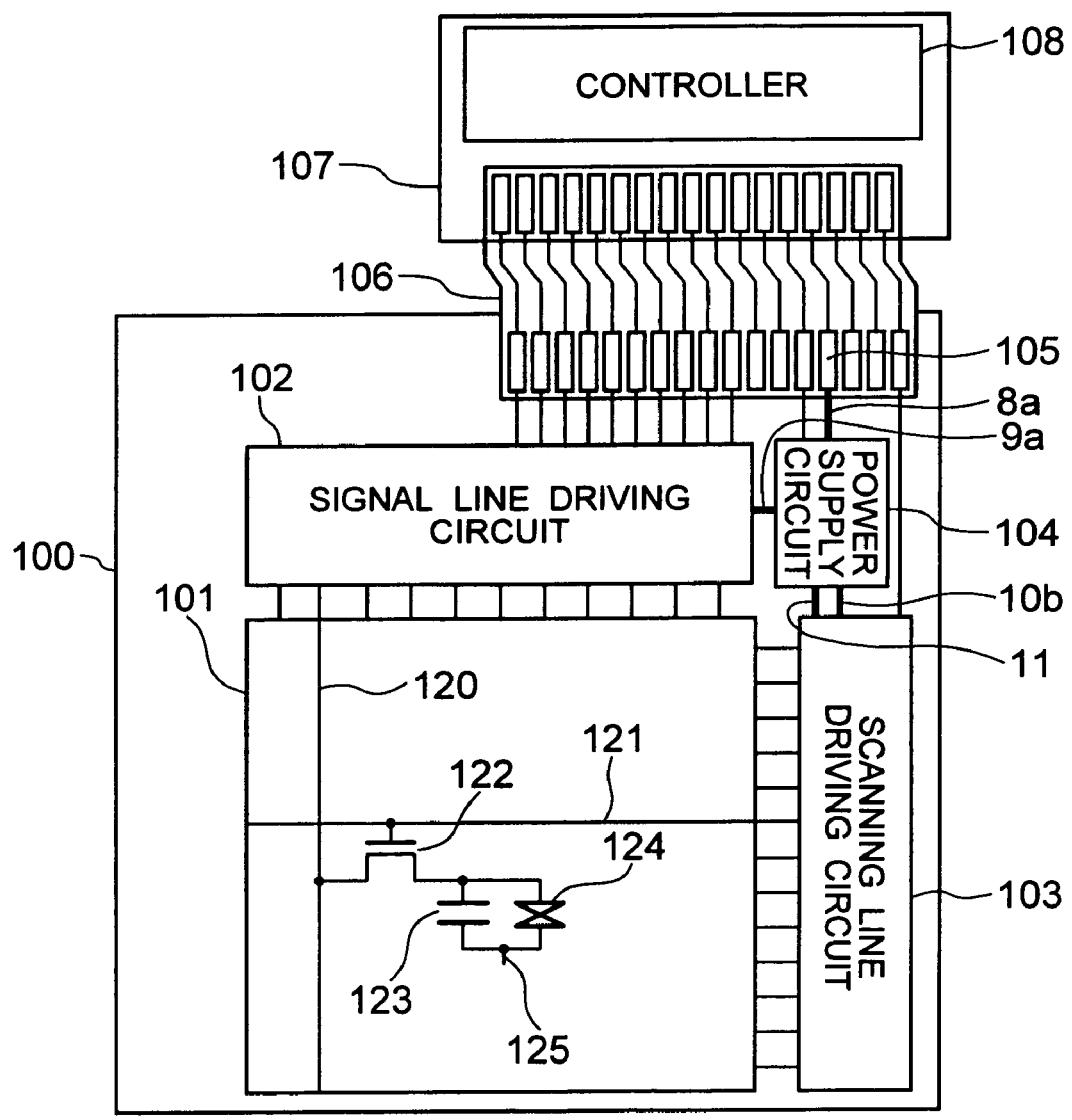
FIG. 10 is a circuit diagram for showing EXAMPLE 1 of the semiconductor device according to the present invention.
Figure 11:
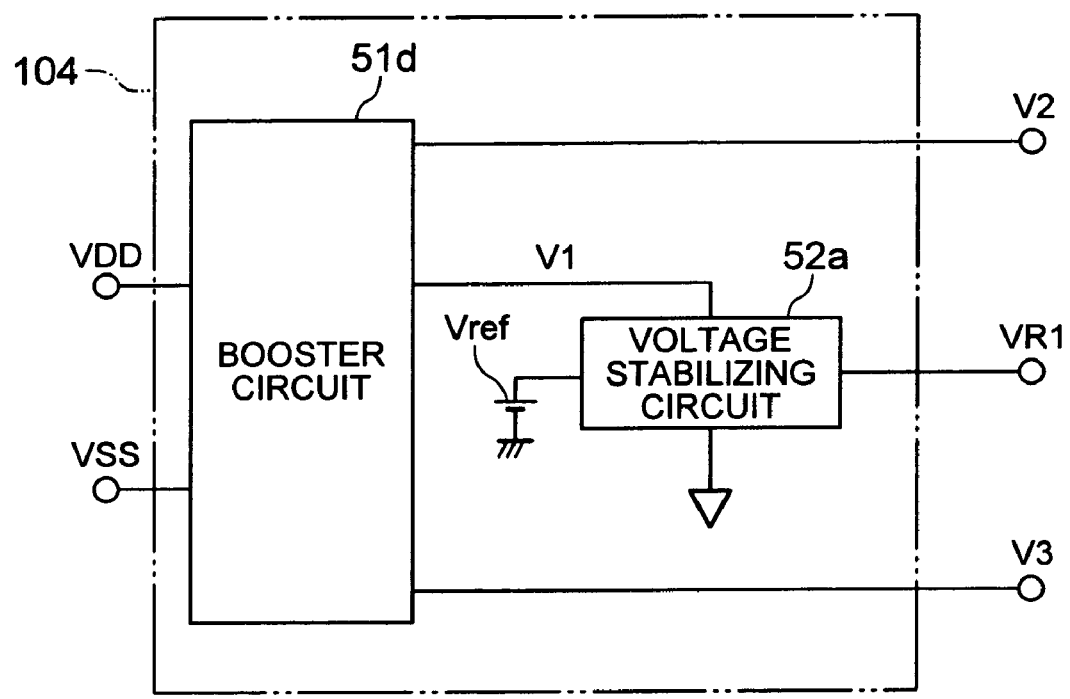
FIG. 11 is a block diagram for showing a power supply circuit of EXAMPLE 1.

FIG. 10 is a circuit diagram for showing EXAMPLE 1 of the semiconductor device according to the present invention. FIG. 11 is a block diagram for showing the power supply circuit shown in FIG. 10. Description will be provided hereinafter by referring to the drawings.

On a substrate 100, formed are a display unit 101 such as liquid crystal, a signal line driving circuit 102, a scanning line driving circuit 103, a power supply circuit 104 for generating the supply voltage which is used by the above-mentioned components, a signal wiring (the numeral reference is omitted) and power supply wirings 8*a*, 9*a*, 10*b*, 11 for transmitting the signals from outside of the substrate and the supply voltage to the circuits on the substrate 100, a coupling terminal 105 for inputting the supply voltage, and the like. The power supply circuit 104 is disposed adjacent to the coupling terminal 105 so that the power supply wiring 8a is shortened. Also, the power supply circuit 104 is disposed adjacent to the signal line driving circuit 102 so that the power supply wiring 9a for supplying the output voltage generated by the power supply circuit 104 to the signal line driving circuit 102 becomes short as well. Thereby, the wiring area of the power supply wirings 8a, 9a, which require the low resistance is decreased. Thus, the area of the entire display device on the substrate 100 can be decreased.

Further, the substrate 100 is coupled to an external substrate 107 through an FPC 106. A controller 108 is provided to the external substrate 107.

The display unit 101 is constituted of signal lines 120 and scanning lines 121 arranged in matrix, pixel TFTs 122 disposed at intersection points of the signal lines 120 and the scanning lines 121, a storage capacity 123, a liquid crystal 124 and the like. These structural elements are illustrated one each on the drawing for convenience' sake, however, there are a large number of them in practice.

The scanning line driving unit 103 is constituted of a shift resistor and a buffer circuit, which are not shown, and performs vertical scanning through generating vertical selection pulses in order by synchronizing with a vertical transfer clock (not shown). By controlling the value (high/low) of the electric potential supplied to the scanning lines 121 at the vertical scanning timing, the pixel TFTs 122 can be set in the selected state or unselected state.

The signal line driving circuit 102 is constituted of a shift register, a latch circuit and a digital-analog converter (referred to as "DAC" hereinafter) and the like, which are not shown. The video signal inputted to the signal line driving circuit 102 is held by the latch circuit. Also, the signal line driving circuit 102 performs horizontal scanning through generating horizontal selection pulses by synchronizing with a horizontal transfer clock (not shown). The electric potential in which the latched video signal is converted into the analog voltage is sampled by the signal lines 120 at the horizontal scanning timing. The electric potential is applied to the liquid crystal 124 and the storage capacity 123 through the selected pixel TFT 122. According to a difference between the voltage and the voltage of a common voltage terminal 125, the transmittivity of the liquid crystal 124 changes and the gradation is expressed thereby.

As for the supply voltage of the signal line driving circuit 102, required is the voltage higher than the data voltage which is applied to the liquid crystal. In general, it is higher than the voltage supplied from an external power supply such as a battery. Further, the power consumption of the signal line driving circuit 102 fluctuates depending on a picture being displayed, so that it is a supply voltage with a large load fluctuation for the power supply circuit 104.

Therefore, in order to supply the stable voltage to the signal line driving circuit 102, it is necessary to boost the electrical potential of the supply voltage VDD outputted from outside by the booster circuit 51b and, then, output it through the voltage stabilizing circuit 52a.

At least two supply voltages are required for the scanning line driving circuit 103. The one is the high voltage for the pixel TFT 122 to be selected and the other is the low voltage for the pixel TFT 122 to be unselected. It is necessary that the high voltage is higher than the data voltage for at least the amount of the threshold voltage of the pixel TFT 122. Further, in general, the negative power supply is used for the low voltage in many cases so that the pixel TFT 122 is surely unselected for inversing the polarities of the voltage to be applied to the liquid crystal by a constant period so as to prevent the deterioration of the liquid crystal even in the case where the terminal on the pixel TFT 122 side of the storage capacity 123 or the signal line 120 becomes the negative electric potential.

The power supply circuit 104 supplies the supply voltage to the signal line driving circuit 102 and the scanning line driving circuit 103. The power supply circuit 104 converts the supply voltage VDD inputted from the external controller 108 through the coupling terminal 105 and the power supply wiring 8a into the positive and negative high-pressure voltages by the booster circuit 51d. The boosted voltage V1 obtained by boosting a supply voltage VDD twice as high is converted by the voltage stabilizing circuit 52 into a stable voltage VR1 which is stable for the load fluctuation and is supplied to the signal line driving circuit 102 through the power supply wiring 9a. A three-time boosted voltage V2 obtained by boosting a supply voltage VDD three times as high is supplied to the scanning line driving circuit 103 through the power supply wiring 10b and is used as the selected voltage of the pixel TFT 122. Further, an inverseboosted voltage V3 obtained by negatively boosting a supply voltage VDD twice as much is supplied to the scanning line driving circuit 103 through the power supply wiring 11 and used as the unselected voltage of the pixel TFT 122.

Figure 12:
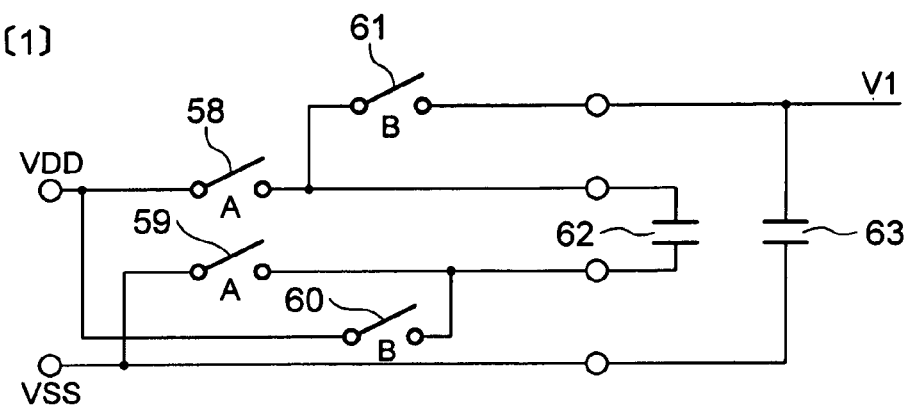
Figure 12:
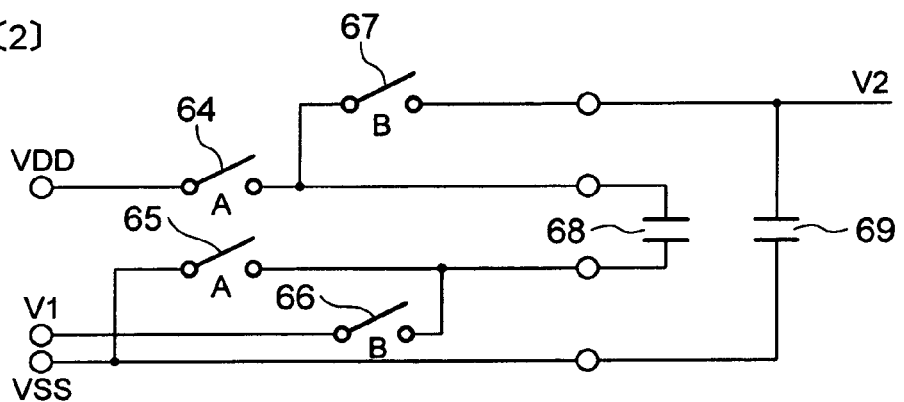
Figure 12:
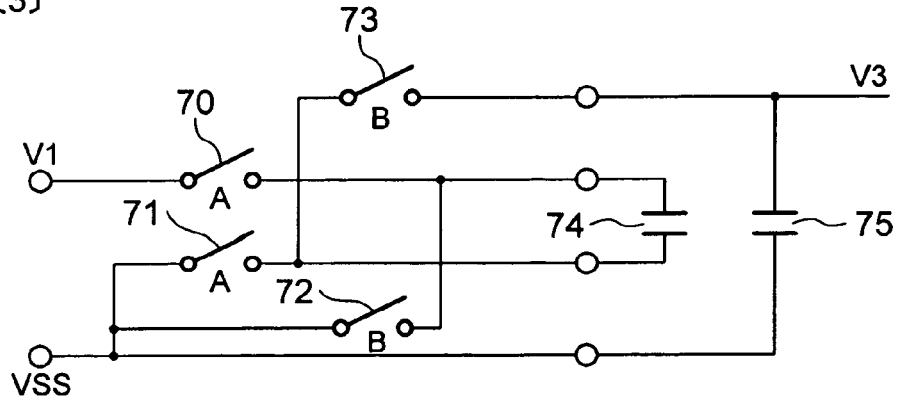

FIG. 12 are circuit diagrams for showing a booster circuit shown in FIG. 11, in which FIG. 12 is a first circuit, FIG. 12 is a second circuit, and FIG. 12 is a third circuit. Description will be provided hereinafter by referring to the FIG. 11 and FIG. 12.

The booster circuit 51d is constituted of the three circuits shown in FIG. 12. The first circuit is the same configuration as that of FIG. 6, which is a two-time booster circuit constituted of switches 58-61, a boosting capacity 62, and a storage capacity 63. At a timing A, the switches 58, 59 are connected and the supply voltage VDD is held in the boosting capacity 62. Subsequently, at a timing B, the switches 60, 61 are connected and the electric potential of the output terminal is boosted to be 2×VDD to be the boosted voltage V1. The boosted voltage V1 is held in the storage capacity 63.

The second circuit is constituted of switches 64-67, a boosting capacity 68, and a storage capacity 69, which generates the boosted voltage three times as high. At a timing A, the switches 64, 65 are connected and the supply voltage VDD is held in the boosting capacity 68. Subsequently, at a timing B, the switches 66, 67 are connected and the electric potential of the output terminal is boosted to be 3×VDD to be the three-time boosted voltage V2. The three-time boosted voltage V2 is held in the storage capacity 69.

The third circuit is constituted of switches 70-73, a capacity 74, and a storage capacity 75. At a timing A, the switches 70, 71 are connected and the boosted voltage V1 (2×VDD) is held in the capacity 74. Subsequently, at a timing B, the switches 72, 73 are connected and the electric potential of the output terminal is inversed to be −2×VDD to be the inversely boosted voltage V3. The inversely boosted voltage V3 is held in the storage capacity 75.

Figure 13:
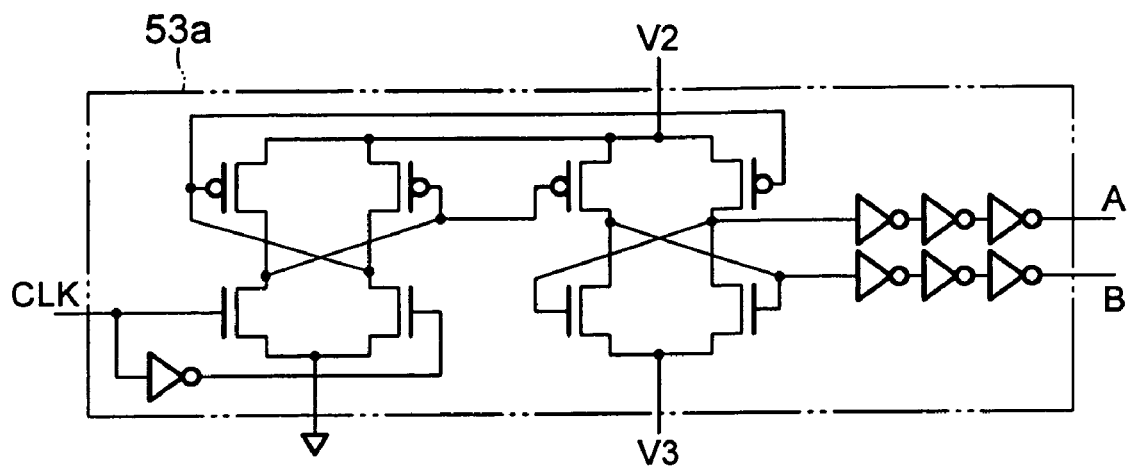
FIG. 13 is a circuit diagram for showing a level shift circuit for driving the booster circuit of EXAMPLE 1.
Figure 14:
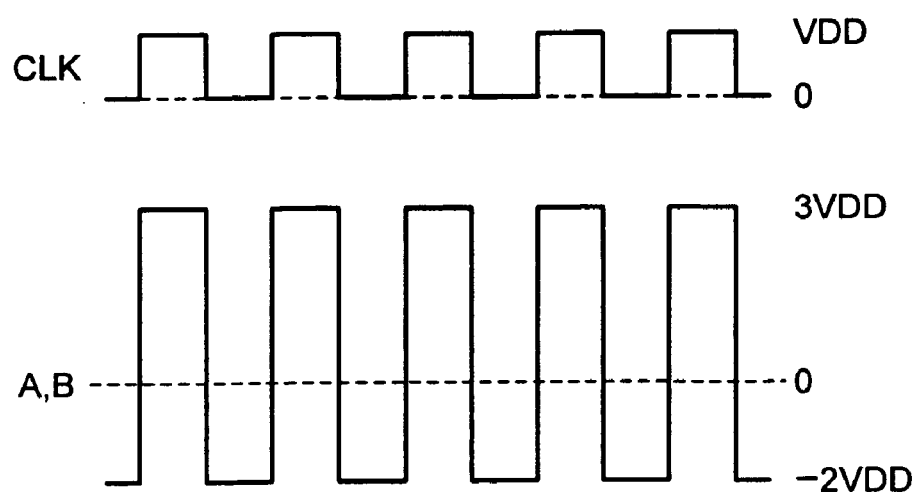
FIG. 14 is a waveform chart for showing the input/output signal of the level shift circuit of EXAMPLE 1.

FIG. 13 is a circuit diagram for showing a level shift circuit for driving the booster circuit shown in FIG. 12. FIG. 14 is a waveform chart showing the input/output signal of the level shift circuit shown in FIG. 13. Description will be provided hereinafter by referring to FIG. 10-FIG. 14.

The level shift circuit 53a generates the signals A, B for driving each of the switches 58—of the booster circuit 51d and is included in the power supply circuit 104. The level shift circuit 53a converts the low-amplitude clock signal CLK to the high-amplitude signal as shown in FIG. 14 using the three-time boosted voltage V2 and the inversely boosted voltage V3. The configuration and the operation of the level shift circuit 53a follow those of the level shift circuit shown in FIG. 8.

Example 2

Next, EXAMPLE 2 of the present invention will be described by referring to the drawings. The EXAMPLE is a case of a sensor device formed on a substrate such as glass.

Figure 15:
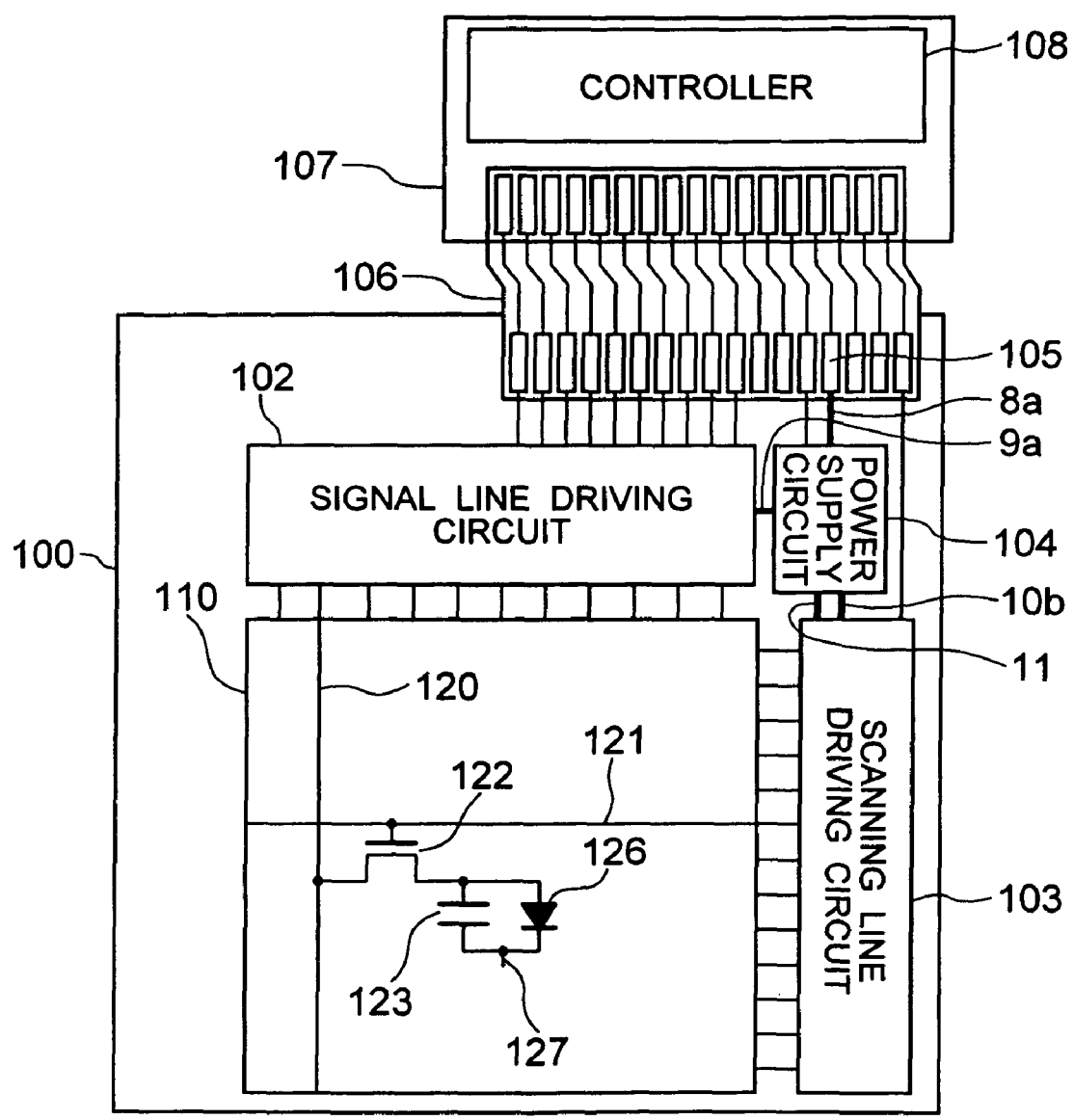
FIG. 15 is a circuit diagram for showing EXAMPLE 2 of the semiconductor device according to the present invention.

FIG. 15 is a circuit diagram for showing EXAMPLE 2 of the semiconductor device according to the present invention. Description will be provided hereinafter by referring to the drawing. However, the description of the same components as the ones in FIG. 10 will be omitted by applying the same reference numerals.

On a substrate 100, formed are a sensor unit 110 such as photodiode, a signal line driving circuit 102, a scanning line driving circuit 103, a power supply circuit 104 for generating the supply voltage which is used by the above-mentioned components, a signal wiring (the numeral reference is omitted) and power-supply wirings 8a, 9a, 10b, 11 for transmitting the signals from outside of the substrate 100 and the supply voltage to the circuits on the substrate 100, a coupling terminal 105 for inputting supply voltage, and the like. The power supply circuit 104 is disposed adjacent to the coupling terminal 105 so that the power supply wiring 8a is shortened. Also, the power supply circuit 104 is disposed adjacent to the signal line driving circuit 102 so that the power supply wiring 9a for supplying the output voltage generated by the power supply circuit 104 to the signal line driving circuit 102 becomes short as well. Thereby, the wiring area of the power supply wirings 8a, 9a, which require low resistance is decreased so that the area of the entire sensor device on the substrate 100 can be decreased.

The sensor unit 110 is constituted of signal lines 120 and scanning lines 121 arranged in matrix, pixel TFTs 122 disposed at intersection points of the signal lines 120 and the scanning lines 121, a storage capacity 123, a photodiode 126 and the like. These structural elements are illustrated one each on the drawing for convenience' sake, however, there are a large number of them in practice. An end of the photodiode 126 is coupled to a common voltage terminal 127. When the positive voltage is applied to the common voltage terminal 127 so that the photodiode 126 is in the reversed bias state, an electric current according to the light amount is flown. The electric current is stored in the storage capacity 123 as the pixel signal charge.

The scanning line driving unit 103 is constituted of a shift resistor and a buffer circuit, which are not shown, and performs vertical scanning through generating vertical selection pulses in order by synchronizing with a vertical transfer clock (not shown). By controlling the value (high/low) of the electric potential supplied to the scanning lines 121 at the vertical scanning timing, the pixel TFTs 122 can be set in the selected state or unselected state.

The signal line driving circuit 102 is constituted of a shift register, a sense-amplifier circuit, an ADC and the like, which are not shown. The signal line 120 is charged to the voltage according to a video signal level by the electric charge of the storage capacity 123 being selected in order by the vertical scanning performed by the scanning lining driving circuit 103. After being amplified by the sense-amplifier circuit, it is converted to the digital signal by the ADC.

In the power supply circuit 104 of the sensor device, the voltage of about twice as high as the supply voltage VDD, which is stable for the fluctuation of the load current, is also supplied to the signal line driving circuit 102. The voltage is also used by being applied to the common voltage terminal 127 so that the photodiode 126 is in the reversed bias state. In the scanning line driving circuit 103, the voltage for selecting or unselecting the pixel TFT 122, which is similar to that of the case of the display unit, is supplied.

As examples of utilizing the present invention, there are devices having an active matrix region, such as a portable terminal and a portable telephone to which a liquid crystal display device and an EL display device is mounted, or a portable fingerprint reader to which an optical secondary sensor is mounted.

What is claimed is:

1. An active matrix type semiconductor device, comprising:
   an active matrix region including a plurality of signal lines and a plurality of scanning lines being arranged in matrix and switch devices, which are controlled through the signal lines and the scanning lines, being disposed at intersection points of the signal lines and the scanning lines, and loads being coupled to said switch devices;
   a coupling terminal group used for electrically coupling a scanning line driving circuit for driving the scanning lines and a signal line driving circuit for driving the signal lines with outside; and
   a power supply circuit for converting supply voltage inputted from a supply voltage input terminal within the coupling terminal group into a prescribed output voltage and supplying the output voltage, by boosting it with a charge pump circuit, to at least the signal line driving circuit,
   wherein:
   the power supply circuit is disposed adjacent to both the signal line driving circuit and the coupling terminal group, wherein the power supply circuit and the signal line driving circuit are disposed in a side of the substrate defined by a first side of said active matrix region, and the signal line driving circuit is disposed between the coupling terminal group and the active matrix region,
   the power supply circuit includes a level shift circuit for driving the charge pump circuit,
   an area of the level shift circuit is $1/8$ to $1/2$ of an area of the charge pump circuit,
   the level shift circuit includes a plurality of inverter stages beginning from a first inverter stage to an n-th inverter stage,
   the inverters in the n-th inverter stage drive the charge pump circuit,
   an area size of the inverters in the n-th inverter stage is $1/10$ to $1/3$ of an area size of the charge pump circuit determined by adding area sizes of switches making up the charge pump circuit, and
   an area size of the inverters in the first inverter stage to the (n−1)th inverter stage is $1/10$ to $1/3$ of the area size of the inverters in a next stage of the first inverter stage to the n-th inverter stage, respectively.

2. The active matrix type semiconductor device according to claim 1, wherein the power supply circuit is disposed adjacent to the scanning line driving circuit.

3. The active matrix type semiconductor device according to claim 1, wherein the power supply circuit is disposed in a corner of a substrate which includes the active matrix type semiconductor device.

4. The active matrix type semiconductor device according to claim 1, wherein the power supply circuit includes a voltage stabilizing circuit for stabilizing the output voltage supplied to said signal line driving circuit.

5. The active matrix type semiconductor device according to claim 1, wherein the power supply circuit includes a booster circuit including the charge pump circuit for boosting the supply voltage for converting it to the output voltage, and a driving circuit for driving the booster circuit.

6. The active matrix type semiconductor device according to claim 1, wherein a load of the active matrix region has a display function.

7. The active matrix type semiconductor device according to claim 1, wherein the load of the active matrix region has a sensing function.

8. The active matrix type semiconductor device according to claim 1, wherein the switch device is a thin-film transistor.

9. The active matrix type semiconductor device according to claim 1, wherein the output voltage supplied to at least the signal line driving circuit is boosted by the charge pump circuit to a voltage higher than the input power supply voltage.

10. The active matrix type semiconductor device of claim 1, wherein:
the area size of the inverters in the n-th stage takes one ratio from the $\frac{1}{10}$ to $\frac{1}{3}$ of the area size of the charge pump circuit, and the area size of the inverters in the stage before the n-th stage takes a ratio identical to the one ratio from the $\frac{1}{10}$ to $\frac{1}{3}$ of an area size of the inverters in a next stage, and the area size of the level shift circuit is a size when n is infinity.

* * * * *